United States Patent
An

(10) Patent No.: US 7,402,478 B2
(45) Date of Patent: Jul. 22, 2008

(54) METHOD OF FABRICATING DUAL GATE ELECTRODE OF CMOS SEMICONDUCTOR DEVICE

(75) Inventor: Tae-Hyun An, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 83 days.

(21) Appl. No.: 11/465,420

(22) Filed: Aug. 17, 2006

(65) Prior Publication Data

US 2007/0048914 A1 Mar. 1, 2007

(30) Foreign Application Priority Data

Aug. 24, 2005 (KR) .................. 10-2005-0077961

(51) Int. Cl.
 *H01L 21/8238* (2006.01)
(52) U.S. Cl. ................... 438/199; 257/E27.108
(58) Field of Classification Search ............ 438/199, 438/202; 257/E27.108, E27.632
 See application file for complete search history.

(56) References Cited

U.S. PATENT DOCUMENTS

| | | | |
|---|---|---|---|
| 6,624,019 B2 * | 9/2003 | Kim | 438/241 |
| 6,939,757 B2 * | 9/2005 | Kim | 438/199 |
| 7,307,273 B2 * | 12/2007 | Currie | 257/18 |
| 7,332,388 B2 * | 2/2008 | Trivedi et al. | 438/199 |
| 2007/0178633 A1 * | 8/2007 | Adetutu et al. | 438/199 |

FOREIGN PATENT DOCUMENTS

| | | |
|---|---|---|
| KR | 1998-0058454 | 10/1998 |
| KR | 2001-0045183 | 6/2001 |
| KR | 2002-0002155 | 1/2002 |

OTHER PUBLICATIONS

English language abstract of Korean Publication No. 1998-0058454.
English language abstract of Korean Publication No. 2001-0045183.
English language abstract of Korean Publication No. 2002-0002155.

* cited by examiner

*Primary Examiner*—Thao P. Le
(74) *Attorney, Agent, or Firm*—Marger Johnson & McCollom, P.C.

(57) ABSTRACT

In an embodiment, a method of fabricating a dual gate electrode includes forming an initial semiconductor layer doped with impurities of a first conductivity type on a semiconductor substrate having a first region and a second region. The initial semiconductor layer of the second region is partially etched to form a recessed semiconductor layer that is thinner than the initial semiconductor layer. Impurities of a second conductivity type different from the first conductivity type are implanted into the recessed semiconductor layer to define a first semiconductor layer in the first region and a second semiconductor layer in the second region, respectively. Then, the first and second semiconductor layers are annealed, and the annealed first semiconductor layer is planarized. The resulting structure may be etched to form gate electrodes that are capable of having high concentrations of impurities.

21 Claims, 16 Drawing Sheets

METHOD OF FABRICATING DUAL GATE ELECTRODE OF CMOS SEMICONDUCTOR DEVICE

This application claims the benefit of Korean Patent Application No. 2005-77961, filed Aug. 24, 2005, the contents of which are hereby incorporated herein by reference in their entirety.

BACKGROUND

1. Field of the Invention

The present invention relates to a method of fabricating a semiconductor device, and more particularly, to a method of fabricating gate electrodes of NMOS and PMOS transistors which may constitute a CMOS semiconductor device.

2. Description of Related Art

A CMOS semiconductor device employs a CMOS transistor circuit composed of an NMOS transistor and a PMOS transistor. The CMOS transistor circuit consumes less power than a semiconductor device composed of a bipolar transistor circuit or an NMOS transistor circuit. For this reason, the CMOS transistor circuit is widely adopted in most semiconductor devices.

Gate electrodes of the NMOS and PMOS transistors of the conventional CMOS transistor circuit are fabricated using a poly-silicon layer doped with n-type impurities. In this case, the PMOS transistor has a buried channel property while the NMOS transistor has a surface channel property. As a result, a short channel effect may deteriorate the leakage current characteristics of the PMOS transistor.

FIGS. 1A through 1C are cross-sectional views illustrating a conventional method of fabricating a dual gate electrode.

Referring to FIG. 1A, a PMOS active region 5P' and an NMOS active region 5N' are defined by forming an isolation layer 3 on a semiconductor substrate 1 having PMOS and NMOS transistor regions P' and N'. A gate insulating layer 9 is formed on the semiconductor substrate 1. A polysilicon layer 11 doped with n-type impurities is formed on the gate insulating layer 9 and then planarized.

Referring FIG. 1B, a photoresist layer pattern 13 exposing the PMOS transistor region P' is formed on the planarized polysilicon layer 11, and p-type impurities 15 are ion-implanted into the polysilicon layer 11 of the PMOS transistor region P' using the photoresist layer pattern as an ion implantation mask. Thereafter, the photoresist layer pattern 13 is removed. This influx of p-type impurities offsets the concentration of n-type impurities already implanted in the planarized polysilicon layer 11. As a result, the PMOS and NMOS transistor regions P' and N' have a p-type polysilicon layer 11a doped with the p-type impurities 15 and an n-type polysilicon layer 11b doped with the n-type impurities, respectively.

Referring to FIG. 1C, the p-type polysilicon layer 11a and the n-type polysilicon layer 11b are patterned to form an NMOS gate electrode 11N' in the NMOS transistor region N' and a PMOS gate electrode 11P' in the PMOS transistor region P', respectively.

According to the conventional fabrication method, it is difficult to form the PMOS gate electrode 11P' and the NMOS gate electrode 11N' with a high concentration of impurities. This is because if the concentration of n-type impurities is increased in the polysilicon layer 11, it is difficult to increase the concentration of p-type impurities in the PMOS transistor region P' of the polysilicon layer 11. That is, even if a large dose of p-type impurities are ion-implanted, there is a limit to offsetting the high concentration of n-type impurities already implanted. Also, there is a limit to the concentration of p-type impurities that the polysilicon layer 11 can sustain. As a result, the PMOS and NMOS gate electrodes 11P' and 11N' have low concentrations of impurities, which may cause a poly-depletion effect that leads to an increase in the effective thickness of the gate insulating layer and eventual change in a threshold voltage.

SUMMARY

An embodiment provides a method of fabricating a dual gate electrode of a CMOS semiconductor device by which a poly-depletion effect can be prevented and the properties of a transistor can be improved.

In one aspect, embodiments include a method of fabricating a dual gate electrode, in which an initial semiconductor layer doped with impurities of a first conductivity type is formed on a semiconductor substrate having first and second regions. The initial semiconductor layer of the second region is partially etched to form a recessed semiconductor layer that is thinner than the initial semiconductor layer. Impurities of a second conductivity type different from the first conductivity type are implanted into the recessed semiconductor layer to define a first semiconductor layer in the first region and a second semiconductor layer in the second region, respectively. The first and second semiconductor layers are annealed. The annealed first semiconductor layer is planarized to remove an upper region of the annealed first semiconductor layer.

An impurity concentration of an upper region of the initial semiconductor layer may be higher than that of a lower region of the initial semiconductor layer The initial semiconductor layer may be formed of a polysilicon layer.

The first and second conductivity types may be an n-type and a p-type, respectively. Here, the first and second regions may be NMOS and PMOS transistor regions, respectively.

Alternatively, the first and second conductivity types may be a p-type and an n-type, respectively. Here, the first and second regions may be PMOS and NMOS transistor regions, respectively.

The initial semiconductor layer may be partially etched to a depth of ¼ to ½ of the thickness of the initial semiconductor layer.

Impurities in the upper region of the first semiconductor layer may be diffused into a lower region thereof during the annealing process.

A metal silicide layer may be formed on the substrate having the planarized first semiconductor layer. The metal silicide layer, the planarized first semiconductor layer, and the annealed second semiconductor layer may be patterned to form first and second gate electrodes in the first and second regions, respectively.

In another aspect, embodiments includes a method of fabricating a dual gate electrode, in which a semiconductor substrate having a cell region, an NMOS transistor region, and a PMOS transistor region are prepared, and a channel trench is formed by etching the semiconductor substrate of the cell region. An initial semiconductor layer doped with n-type impurities is formed on the semiconductor substrate having the channel trench to fill the channel trench of the substrate and cover the semiconductor substrate. The initial semiconductor layer of the PMOS transistor region is partially etched to form a recessed semiconductor layer that is thinner than the initial semiconductor layer. The recessed semiconductor layer is doped with p-type impurities to define a first semiconductor layer in the cell region and the NMOS transistor region and a second semiconductor layer in the PMOS transistor region. The first and second semiconductor layers are annealed. The annealed first semiconductor layer is planarized to remove an upper region thereof.

The initial semiconductor layer may be formed of a polysilicon layer.

An impurity concentration of an upper region of the initial semiconductor layer is higher than that of a lower region of the initial semiconductor layer.

Before forming the initial semiconductor layer, a gate insulating layer may be formed on a surface of the semiconductor substrate and an inner wall of the channel trench.

Impurities in the upper region of the first semiconductor layer may be diffused into a lower region of the first semiconductor layer during the annealing process.

A metal silicide layer is formed on the substrate having the planarized first semiconductor layer. The metal silicide layer, the planarized first semiconductor layer, and the annealed second semiconductor layer may be patterned to form a cell gate electrode, an NMOS gate electrode, and a PMOS gate electrode in the cell region, the NMOS transistor region, and the PMOS transistor region, respectively.

BRIEF DESCRIPTION OF THE DRAWINGS

The foregoing and other objects, features and advantages of the invention will be apparent from the more particular description of exemplary embodiments, as illustrated in the accompanying drawings. The drawings are not necessarily to scale, emphasis instead being placed upon illustrating the principles of the embodiments.

DETAILED DESCRIPTION

Figure 1A:
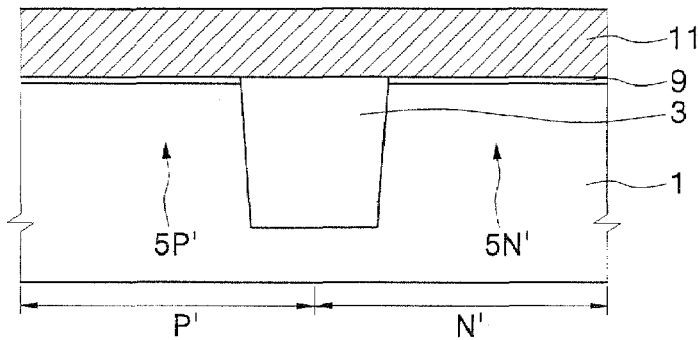
FIGS. 1A through 1C are cross-sectional views illustrating a conventional method of fabricating a dual gate electrode.
Figure 1B:
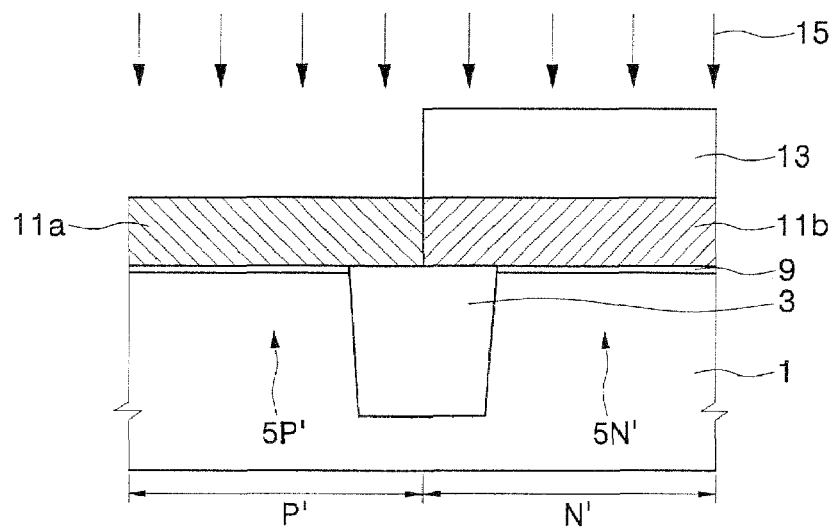
Figure 1C:
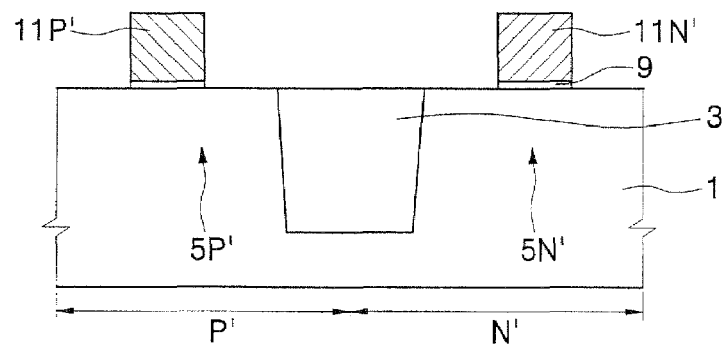

The present invention will now be described more fully hereinafter with reference to the accompanying drawings, in which exemplary embodiments are shown. This invention may, however, be embodied in different forms and should not be construed as limited to the exemplary embodiments set forth herein. Rather, these exemplary embodiments are provided so that this disclosure is thorough and complete and fully conveys the scope of the invention to those skilled in the art. In the drawings, the thicknesses of layers and regions may be exaggerated for clarity. The same reference numerals are used to denote the same elements.

FIGS. 2 through 10 are cross-sectional views illustrating a method of fabricating a dual gate electrode according to an exemplary embodiment.

Figure 2:
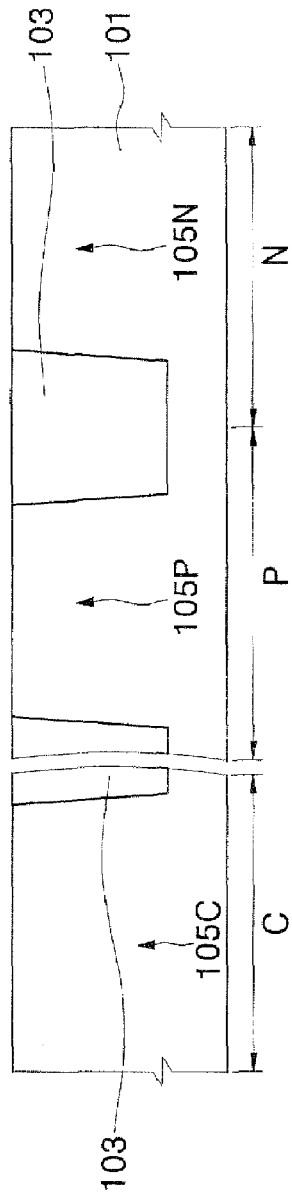
FIGS. 2 through 10 are cross-sectional views illustrating a method of fabricating a dual gate electrode according to an exemplary embodiment.

Referring to FIG. 2, a semiconductor substrate 101 having a cell region C and a peripheral circuit region is provided. The peripheral circuit region may include a first region N and a second region P. The first and second regions N and P may be an NMOS transistor region N and a PMOS transistor region P, respectively. An isolation layer 103 is formed in the semiconductor substrate 101 having the cell region C and the NMOS and PMOS transistor regions N and P. The isolation layer 103 may be formed by, for example, an STI (Shallow Trench Isolation) process. A cell active region 105C, an NMOS active region 105N, and a PMOS active region 105P are defined in the cell region C, and the NMOS and PMOS transistor regions N and P, respectively, by the isolation layer 103. A P-well (not shown) may be formed in the substrate 101 of the cell region C and the NMOS transistor region N, and an N-well (not shown) may be formed in the substrate 101 of the PMOS transistor region P. The P-well and N-well may be formed before or after forming the isolation layer 103.

Figure 3:
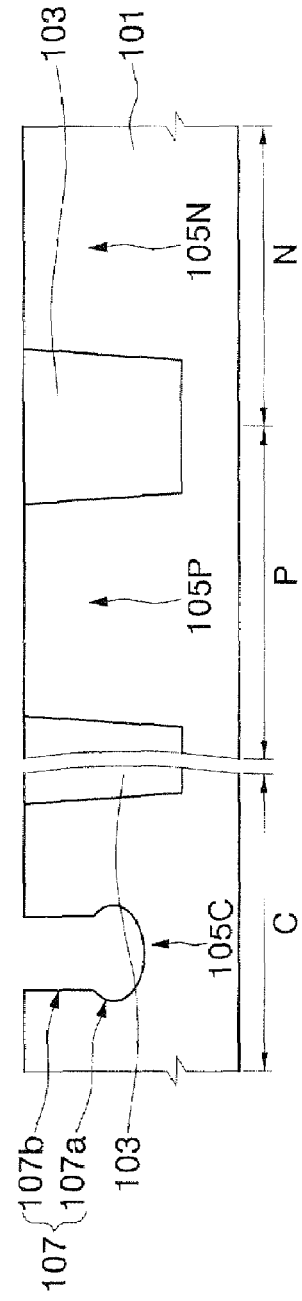

Referring to FIG. 3, a channel trench 107 is formed across the cell active region 105C. The channel trench 107 may be formed by forming a patterned mask layer on the semiconductor substrate 101 and then etching the cell active region 105C using the mask layer as an etch mask. The channel trench 107 may include a lower channel trench 107a having substantially rounded walls, and an upper channel trench 107b disposed on the lower channel trench 107a and having substantially vertical sidewalls. The mask layer may be eliminated after forming the channel trench 107.

Figure 4:
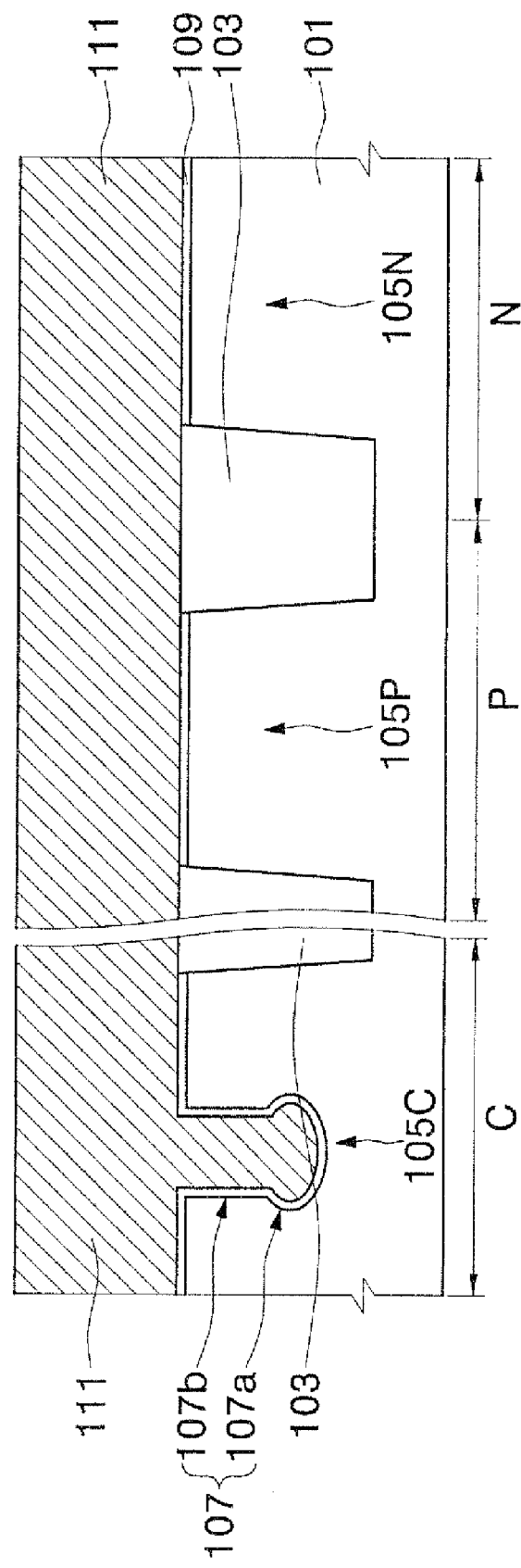

Referring to FIG. 4, a gate insulating layer 109 is formed on the entire surface of the semiconductor substrate 101 where the channel trench 107 is formed. The gate insulating layer 109 may be conformally formed on the surface of the semiconductor substrate 101 and the inner wall of the channel trench 107. The gate insulating layer 109 may be formed by a thermal oxidation process.

An initial semiconductor layer 111 doped with impurities of a first conductivity type is formed on the substrate having the gate insulating layer 109 to fill the channel trench 107 and cover the semiconductor substrate 101. The impurities of the first conductivity type may be n-type impurities. The initial semiconductor layer 111 may be formed of a polysilicon layer. The initial semiconductor layer 111 may be formed to have a thickness of about 900 to 1300 Å from a top surface of the semiconductor substrate 101. Preferably, the initial semiconductor layer 111 is formed to have a thickness of about 1000 to 1200 Å. The n-type impurities may be phosphorus (P) or arsenic (As). The initial semiconductor layer 111 is preferably doped so that the concentration of n-type impurities peaks at an upper region of the initial semiconductor layer 111. More particularly, the concentration of impurities preferably peaks between the top surface and the middle of the initial semiconductor layer 111.

Figure 17:
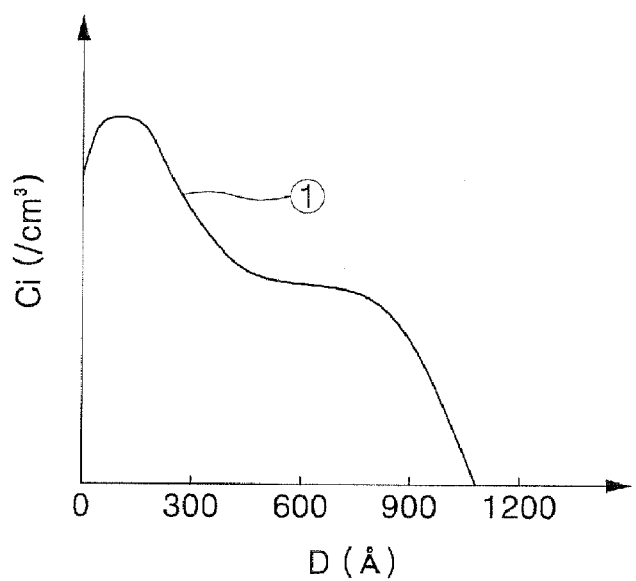
FIGS. 17 and 18 are graphs showing an impurity concentration profile of a semiconductor layer.

FIG. 17 is a graph showing an example of an impurity concentration profile of the initial semiconductor layer 111. The abscissa represents a depth D toward the gate insulating layer 109 in the initial semiconductor layer 111, and the ordinate represents concentration of impurities of a first conductivity type $C_i$.

Referring to FIG. 17, when the initial semiconductor layer 111 is formed to a thickness of about 1100 Å, the peak concentration of impurities may be within a thickness of about 100 Å from the top surface of the initial semiconductor layer 111. Impurities may be implanted into the initial semiconductor layer 111 having the concentration profile of FIG. 17 by an ion implantation technique or an in-situ doping technique. In the case of the ion implantation technique, a projection range Rp of the impurity ions may be controlled by ion injection energy. In the case of the in-situ doping technique, the projection range Rp of the impurities may be controlled by the amount of dopant gas.

Figure 5:
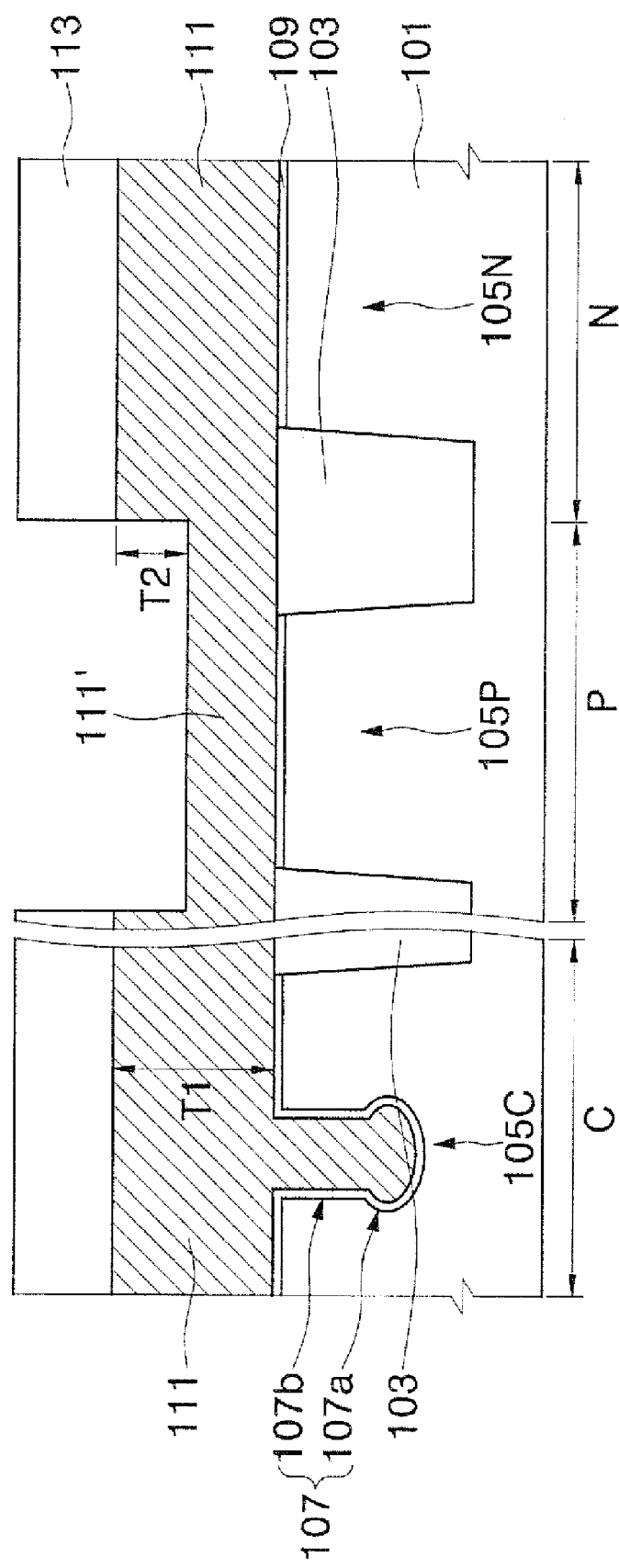

Referring to FIG. 5, a mask layer pattern 113 exposing the PMOS transistor region P may be formed on the initial semiconductor layer 111. The mask layer pattern 113 may be formed of a photoresist layer pattern. The mask layer pattern 113 is utilized as an etch mask to partially etch the initial semiconductor layer 111, thereby forming a recessed semiconductor layer 111' that is thinner than the initial semiconductor layer 111. A thickness T2 of the initial semiconductor layer that is etched away may be ¼ to ½ of the total thickness T1 of the initial semiconductor layer 111, for example. An anisotropic dry etch process may be used for the partial etching process. The recessed semiconductor layer 111' of the PMOS transistor region P is formed by etching the upper region of the initial semiconductor layer 111 having the impurity concentration profile shown in FIG. 17, thereby resulting in a lower impurity concentration than the initial semiconductor layer 111 of the cell region and the NMOS transistor region N. This is because the etched-away upper region of the initial semiconductor layer 111 had the highest impurity concentration, while the recessed portion has the lowest. On the other hand, the impurity concentration is maintained in the initial semiconductor layer 111 of the cell region C and the NMOS transistor region N.

The recessed semiconductor layer 111' may be formed to a thickness of about 600 to 900 Å. Preferably, the recessed semiconductor layer 111' is formed to a thickness of about 700 to 850 Å.

Figure 6:
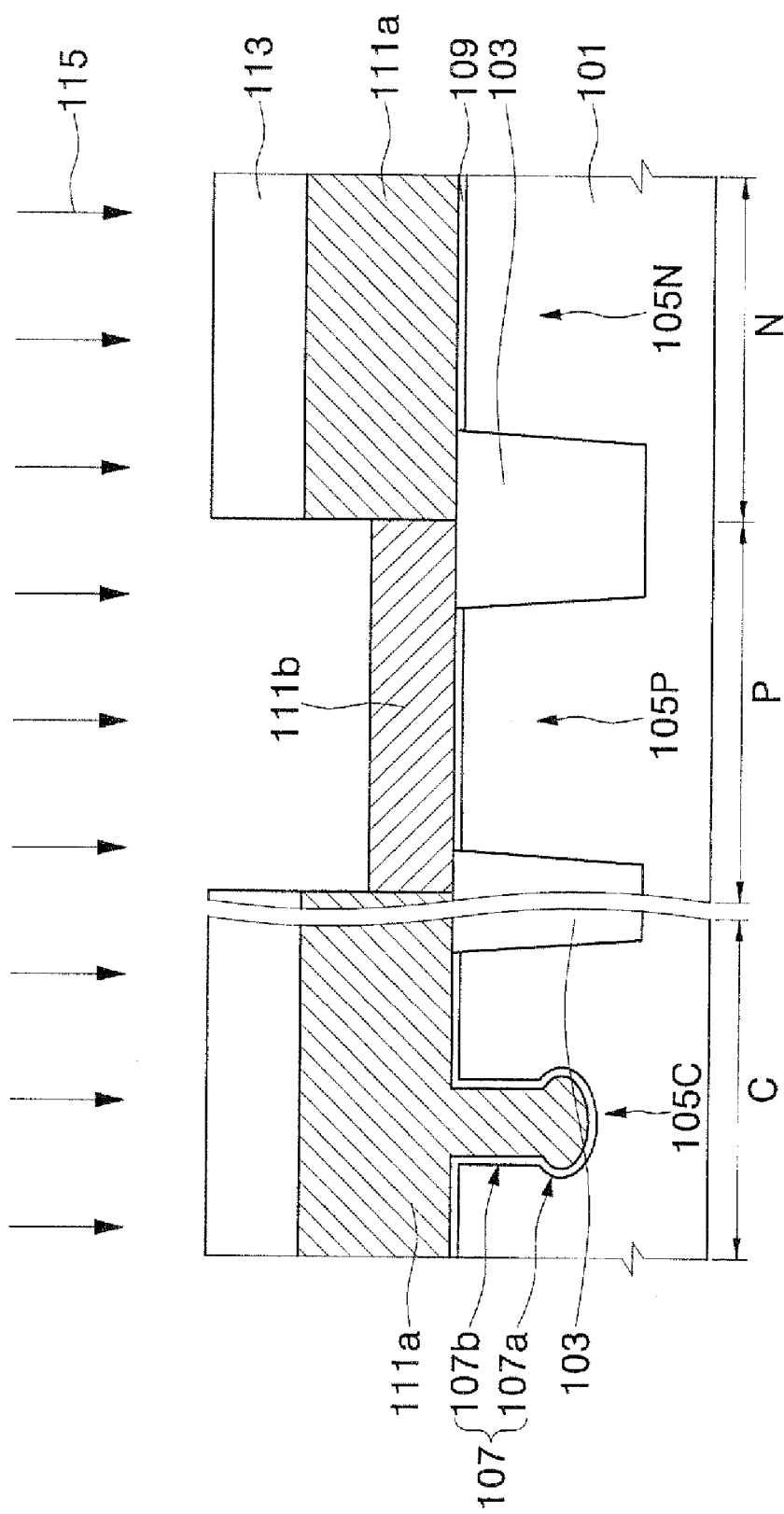

Referring to FIG. 6, impurities of a second conductivity type 115 may be implanted into the recessed semiconductor layer 111', thereby defining a first semiconductor layer 111a of the cell region C and the NMOS transistor region N, and a second semiconductor layer 111b of the PMOS transistor region P. The second conductivity type may be p-type. The p-type impurities 115 may be boron (B), boron difluoride ($BF_2$) or boron trifluoride ($BF_3$), and may be implanted into the recessed semiconductor layer 111'. Here, the mask layer 113 may be used as an ion implantation mask. The ion implantation energy of boron B may be about 1 to 4 keV. Preferably, the ion implantation energy of boron B is about 1.5 to 2.8 keV. The dose of boron B may be about $1 \times 10^{15}$ atom/cm² to $1 \times 10^{17}$ atom/cm², for example. When boron difluoride ($BF_2$) is implanted into the recessed semiconductor layer 111', the ion implantation energy may be about 2 to 10 keV and the dose may be about $1 \times 10^{15}$ atom/cm² to $1 \times 10^{17}$ atom/cm².

Alternatively, the p-type impurities 115 may be implanted into the recessed semiconductor layer 111' by a PLAD (Plasma Assisted Doping) technique. Here, the p-type impurities 115 may include $BF_3$. The plasma ion implantation energy of $BF_3$ may be about 3 to 12 keV, and preferably, may be about 3 to 7 keV. The dose of $BF_3$ may be about $1 \times 10^{15}$ atom/cm² to $1 \times 10^{18}$ atom/cm², and preferably about $1 \times 10^{16}$ atom/cm² to $1 \times 10^{17}$ atom/cm².

After implantation, the mask layer 113 may be removed.

In the present embodiment, the recessed semiconductor layer 111' of the PMOS transistor region P may have a lower concentration of n-type impurities than the initial semiconductor layer 111 in the cell region C and the NMOS transistor region N because the upper region of the initial semiconductor layer 111 doped with the highest concentration of n-type impurities is partially etched away in the PMOS transistor region P. Accordingly, the second semiconductor layer 111b may have a high concentration of p-type impurities 115 which offset the n-type impurities. Once again, this is because the peak concentration of n-type impurities is in the upper region of the initial semiconductor layer 111 which is removed in the PMOS transistor region P.

Figure 7:
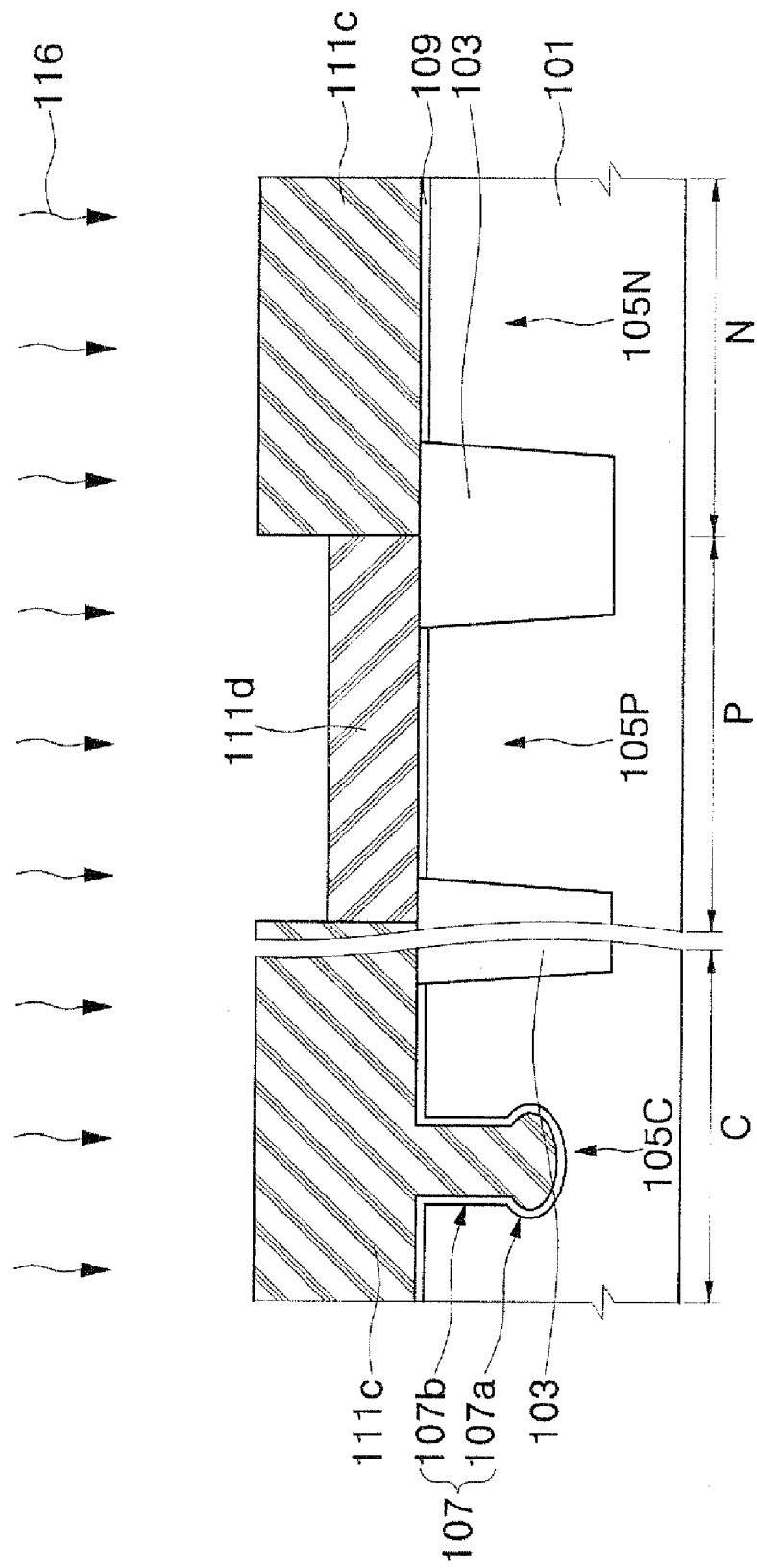

Referring to FIG. 7, the first semiconductor layer 111a and the second semiconductor layer 111b may be annealed 116. Impurities in the upper region of the first semiconductor layer 111a may be diffused into the lower region of the first semiconductor layer 111a during the annealing, thereby increasing the impurity concentration of the lower region of the first semiconductor layer 111a. Here, impurities of the second semiconductor layer 111b may also be diffused. Consequently, the first semiconductor layer 111a and the second semiconductor layer 111b become annealed first and second semiconductor layers 111c and 111d having diffused impurities. The annealing process 116 may be an RTA (Rapid Thermal Annealing) process.

Figure 18:
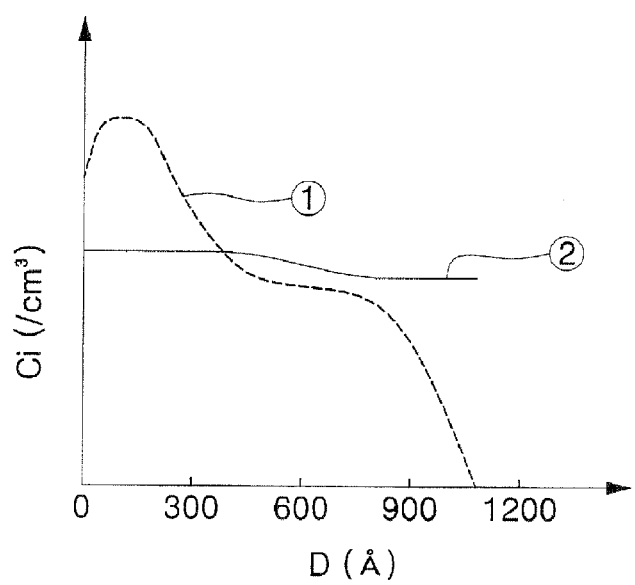

FIG. 18 is a graph showing an example of the impurity concentration profile of the first semiconductor layer before and after annealing.

The impurity concentration curve ① before annealing 116 turns into the impurity concentration curve ② after annealing 116. This is because the annealing process 116 diffuses impurities from the upper region to the lower region of the first semiconductor layer 111a. Therefore, the n-type and p-type impurities may be diffused to have a fairly even distribution in the first and second annealed semiconductor layers 111c and 111d by the annealing process 116.

The annealing process 116 may be performed before planarizing the annealed first semiconductor layer 111c. As a result, a gate electrode to be formed in the cell region C and the NMOS transistor region N may contain a high-concentration of n-type impurities and thus have an improved transistor property.

Figure 8:
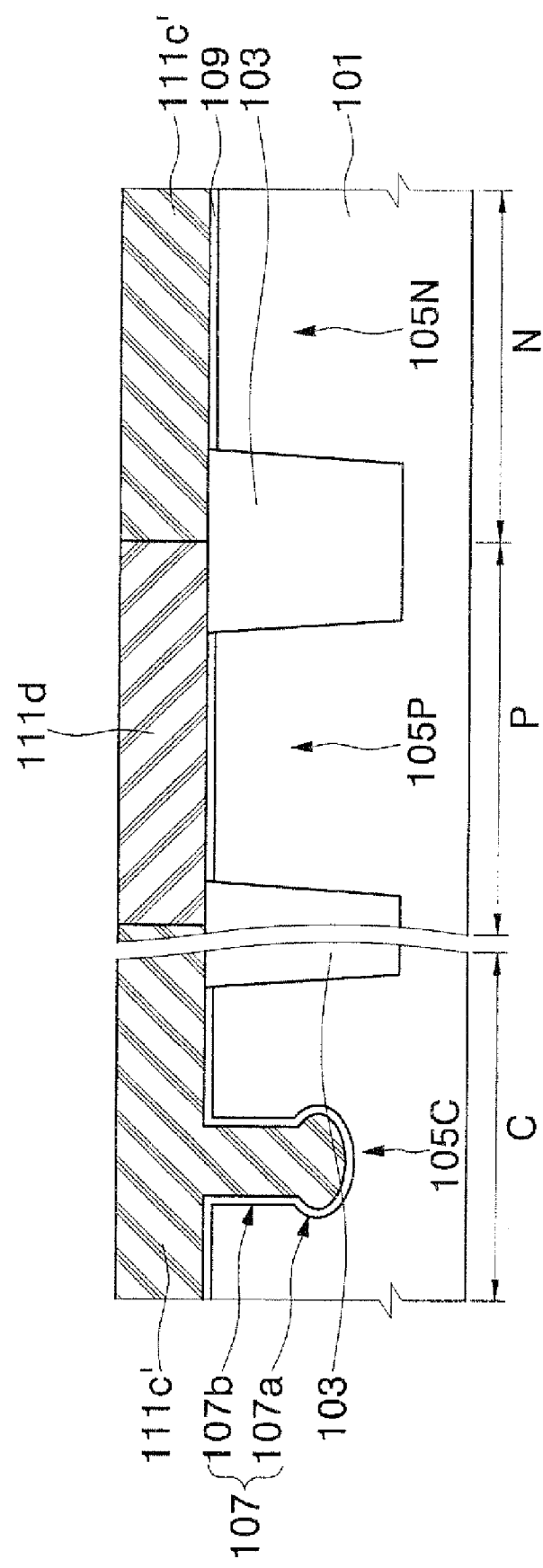

Referring to FIG. 8, a planarized first semiconductor layer 111c' may be formed by planarizing the annealed first semiconductor layer 111c. The top surface of the annealed first semiconductor layer 111c' may have substantially the same level as the top surface of the annealed second semiconductor layer 111d. The planarization process may be a CMP (Chemical Mechanical Polishing) process.

Figure 9:
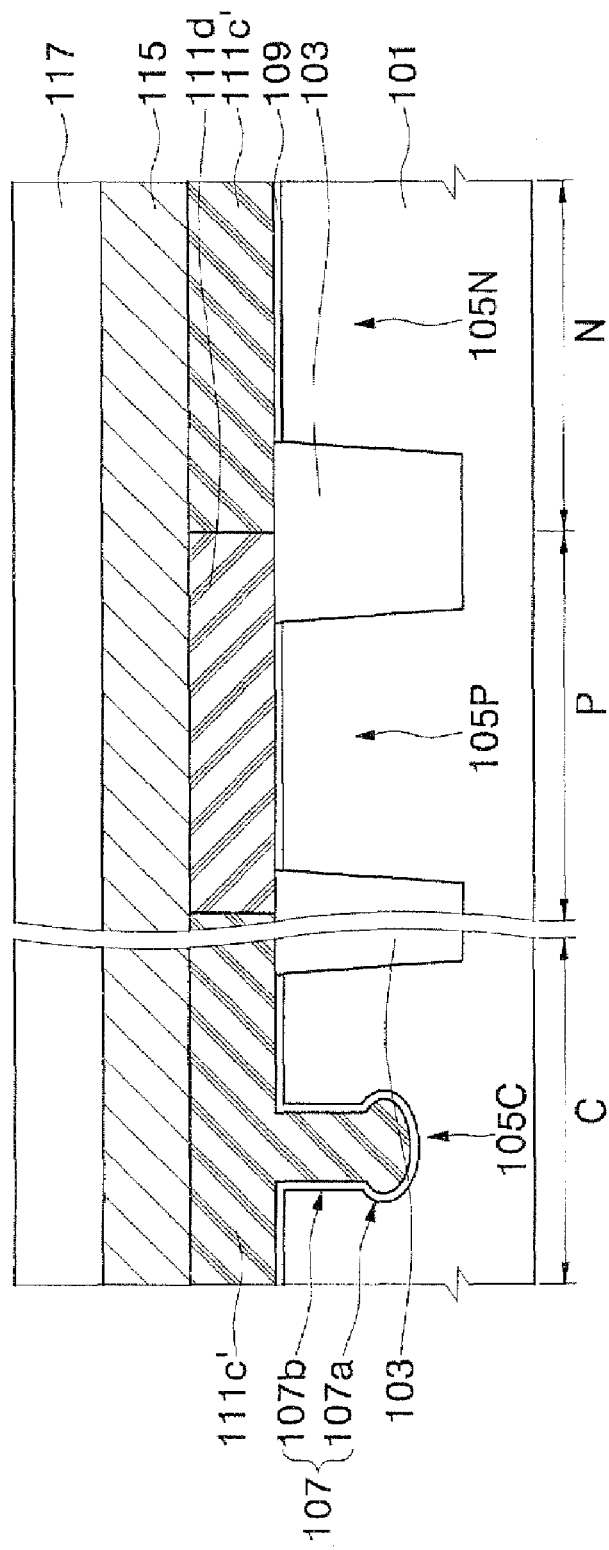
Figure 10:
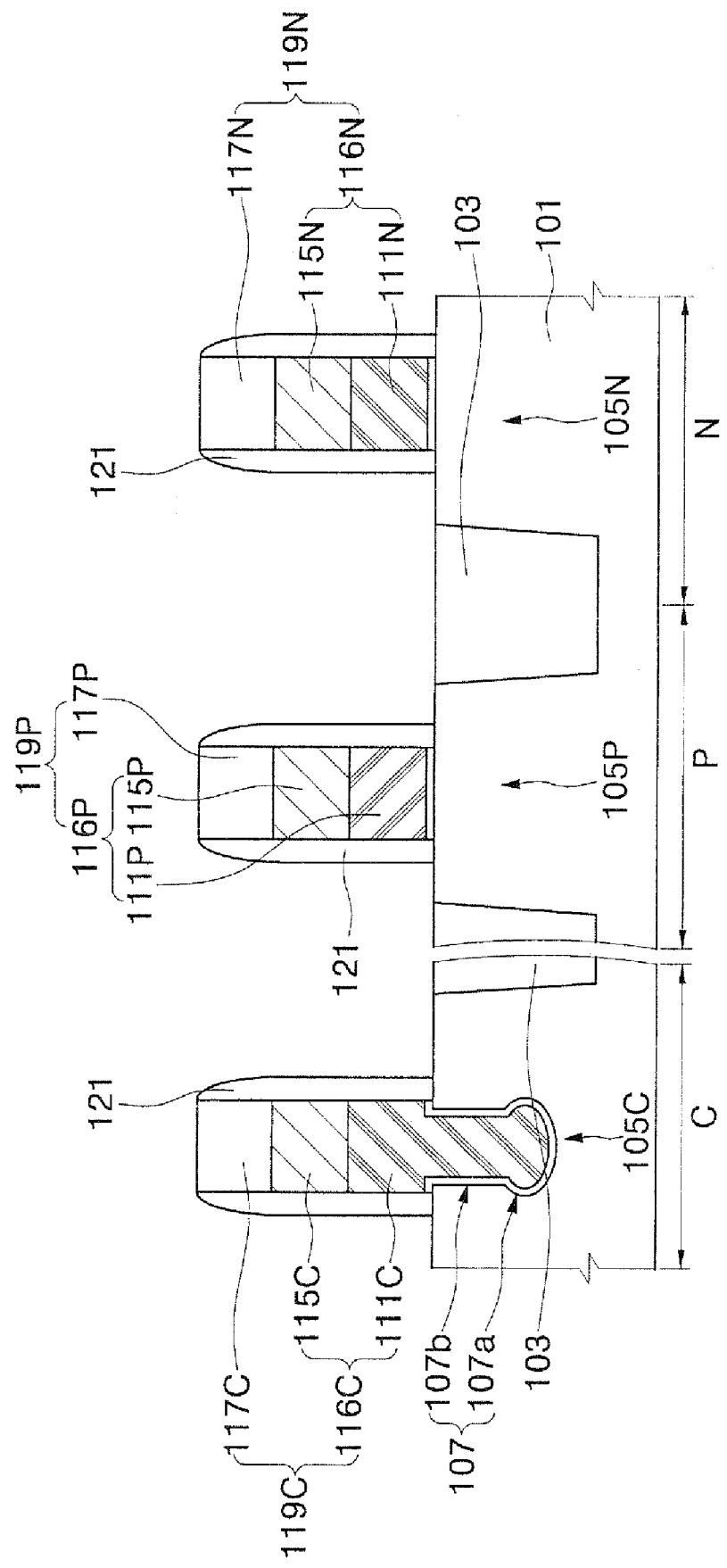

Referring to FIGS. 9 and 10, a metal silicide layer 115 may be formed on the planarized first semiconductor layer 111c' and the annealed second semiconductor layer 11d. The metal silicide layer 115 may be formed of a tungsten silicide layer, for example.

A gate capping layer 117 may then be formed on the metal silicide layer 115. The gate capping layer 117 may be formed of silicon oxide or silicon nitride.

The gate capping layer 117, the metal silicide layer 115, the planarized first semiconductor layer 111c' and the annealed second semiconductor layer 111d may be patterned, thereby forming a cell gate pattern 119C of the cell region C, a PMOS gate pattern 119P of the PMOS transistor region P and an NMOS gate pattern 119N of the NMOS transistor region N, respectively. The cell gate pattern 119C may be composed of a first semiconductor layer pattern 111C, a metal silicide layer pattern 115C, and a gate capping layer pattern 117C, which are stacked. The first semiconductor layer pattern 111C and the metal silicide layer pattern 115C may constitute a cell gate electrode 116C. The NMOS gate pattern 119N may be composed of a first semiconductor layer pattern 111N, a metal silicide layer pattern 115N, and a gate capping layer pattern 117N, which are also stacked.

The first semiconductor layer pattern 111N and the metal silicide layer pattern 115N may constitute a first gate electrode 116N. The first gate electrode 116N may be an NMOS gate electrode. The PMOS gate pattern 119P nay be composed of a second semiconductor layer pattern 111P, a metal silicide layer pattern 115P and a gate capping pattern 117P, which are stacked. The second semiconductor layer pattern 111P and the metal silicide layer pattern 115P may constitute a second gate electrode 116P. The second gate electrode 116P may be a PMOS gate electrode.

Gate spacers 121 may be further formed on sidewalls of the cell gate pattern 119C, the PMOS gate pattern 119P, and the NMOS gate pattern 119N.

According to the present embodiment, the first semiconductor layer pattern 111N of the NMOS transistor region N has a high concentration of n-type impurities, and the second semiconductor layer pattern 111P of the PMOS transistor region P has a high concentration of p-type impurities. Accordingly, NMOS and PMOS transistors that may be respectively formed in the NMOS transistor region N and the PMOS transistor region P may have improved performance.

In addition, a cell transistor that may be formed in the cell region C enables the first semiconductor layer pattern 111C that fills the channel trench 107 to have a high concentration of n-type impurities. Accordingly, any void that may be created in the first semiconductor layer pattern 111C may be prevented from contacting the inner wall of the channel trench 107, so that a stable channel may be formed. That is, a current path of the channel may be prevented from being cut off.

FIGS. 11 through 16 are cross-sectional views illustrating a method of fabricating a dual gate electrode according to another exemplary embodiment.

Referring to FIGS. 2 and 3 again, a semiconductor substrate 101 having a cell region C and a peripheral circuit region is provided. The peripheral circuit region may include a first region P and a second region N. The first and second regions may be a PMOS transistor region P and an NMOS transistor region N, respectively. An isolation layer 103 may be formed in the semiconductor substrate 101 to define a cell active region 105C, an NMOS active region 105N, and a PMOS active region 105P. A channel trench 107 may be formed across the cell active region 105C.

Figure 11:
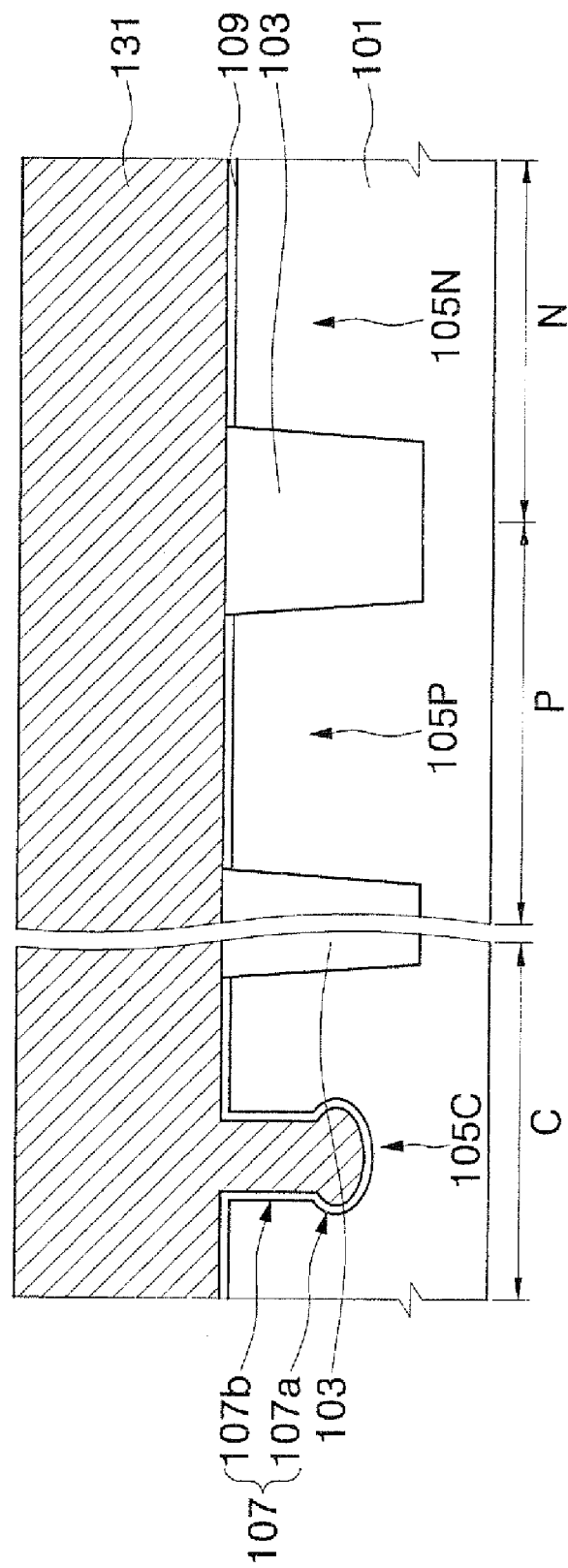
FIGS. 11 through 16 are cross-sectional views illustrating a method of fabricating a dual gate electrode according to another exemplary embodiment.

Referring to FIG. 11, a gate insulating layer 109 is formed on the entire surface of the semiconductor substrate 101 where the channel trench 107 is formed. An initial semiconductor layer 131 doped with p-type impurities may be formed on the gate insulating layer 109 to fill the channel trench 107 and to have a predetermined thickness from the semiconductor substrate 101. The p-type impurities may be boron (B), boron bifluoride ($BF_2$), or boron trifluoride ($BF_3$). The peak concentration of the p-type impurities is in an upper region of the initial semiconductor layer 131, as described earlier.

Figure 12:
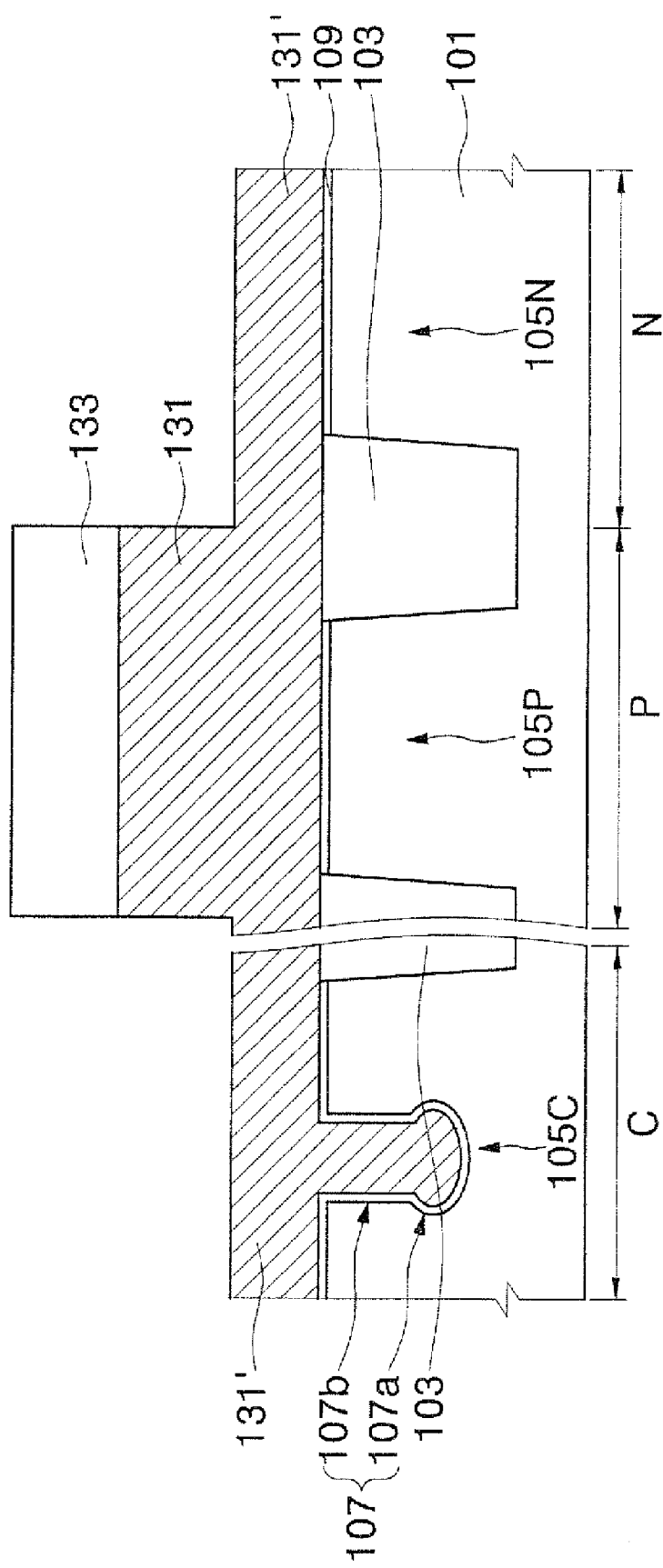

Referring to FIG. 12, a mask layer pattern 133 exposing the cell region C and the NMOS transistor region N may be formed on the initial semiconductor layer 131. The initial semiconductor layer 131 may be partially etched using the mask layer pattern 133 as an etch mask, thereby forming a recessed semiconductor layer 131'.

Figure 13:
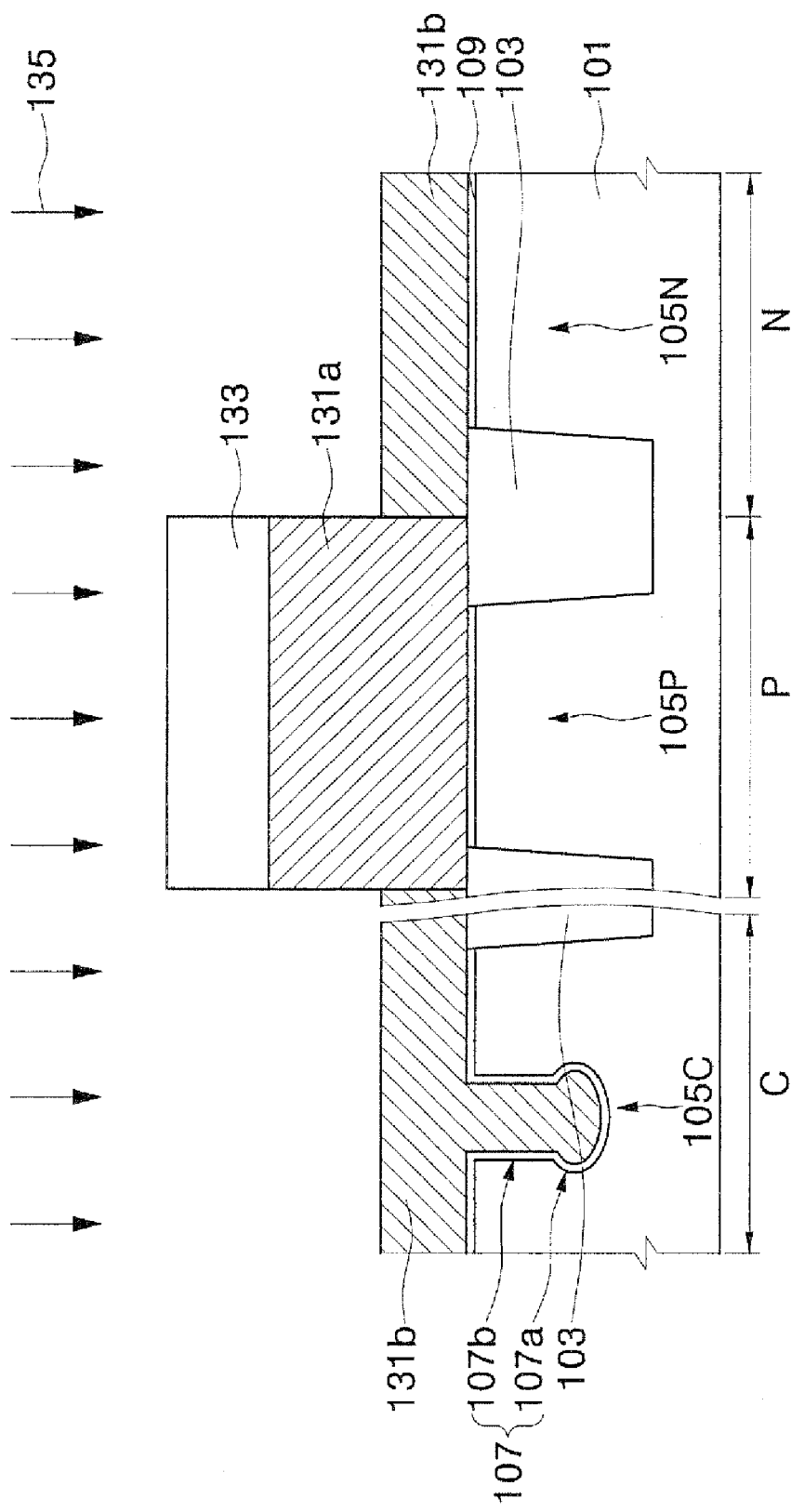

Referring to FIG. 13, n-type impurities 135 may be implanted into the recessed semiconductor layer 131' to define a first semiconductor layer 131a of the PMOS transistor region P and a second semiconductor layer 131b of the cell region C and the NMOS transistor region N. The n-type impurities 135 may be phosphorus (P) or arsenic (As). The n-type impurities 135 may be ion-implanted into the recessed semiconductor layer 131' or implanted using a plasma doping technique.

After implantation, the mask layer pattern 133 may be removed.

Figure 14:
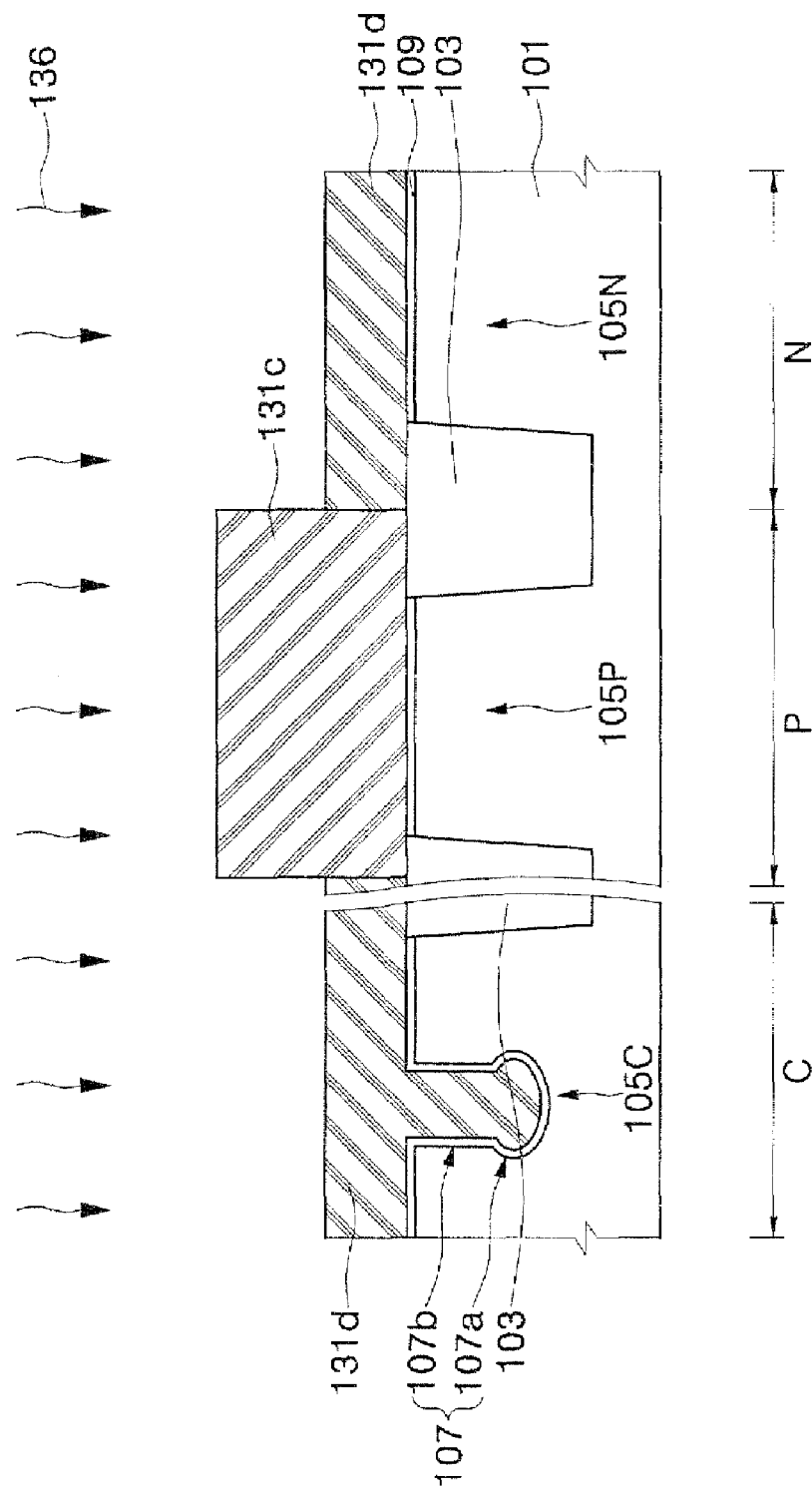

Referring to FIG. 14, the first and second semiconductor layers 131a and 131b may be subjected to an annealing process 136. The annealing process 136 may be an RTA process. The p-type and n-type impurities may then be diffused by the annealing process 136 to have a uniform distribution, thereby forming annealed first and second semiconductor layers 131c and 131d.

Figure 15:
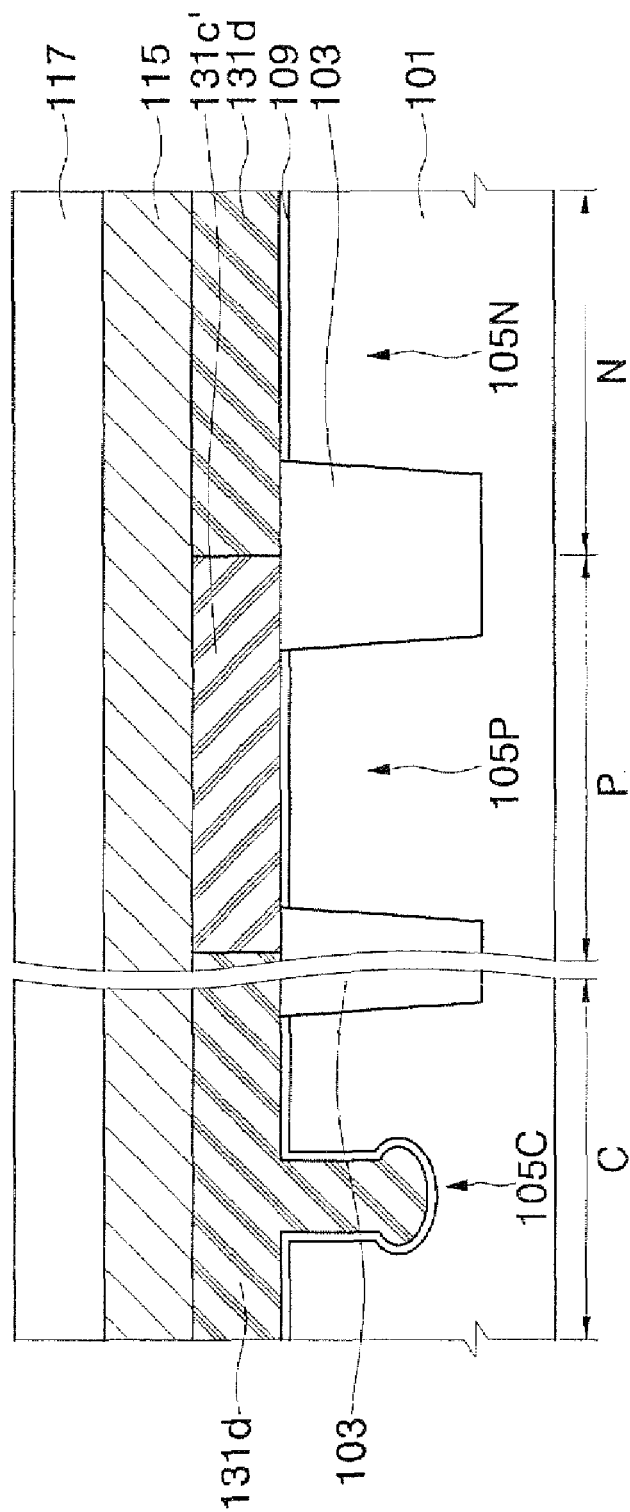

Referring to FIG. 15, a planarized first semiconductor layer 131c' may be formed by planarizing the annealed first semiconductor layer 131c. Here, a top surface of the planarized first semiconductor layer 131c' may have substantially the same level as a top surface of the annealed second semiconductor layer 131d.

A metal silicide layer 115 and a gate capping layer 117 may be sequentially formed on the planarized first semiconductor layer 131c' and the annealed second semiconductor layer 131d.

Figure 16:
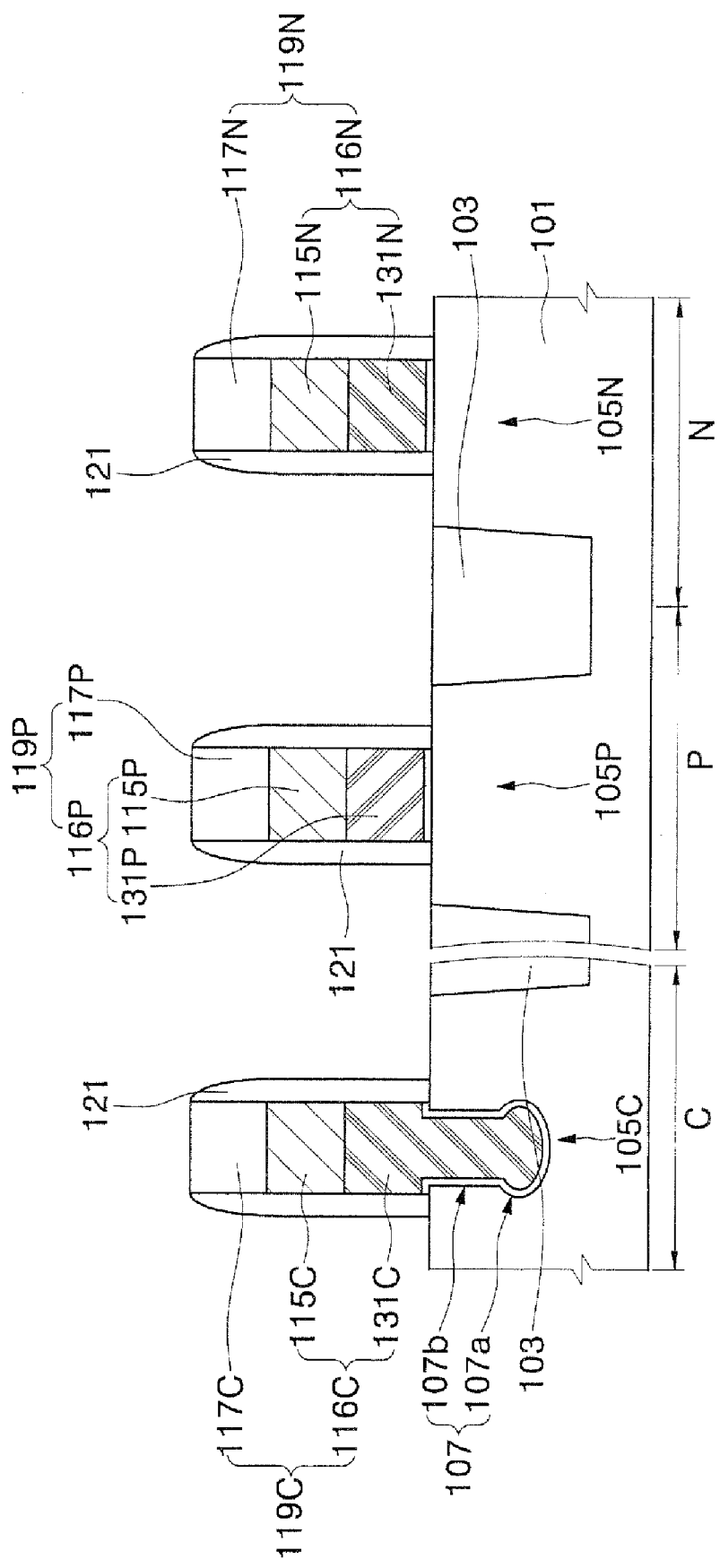

Referring to FIG. 16, the gate capping layer 117, the metal silicide layer 115, the planarized first semiconductor layer 131c', and the annealed second semiconductor layer 131d may be patterned, thereby forming a cell gate pattern 119C in the cell region C, a PMOS gate pattern 119N in the PMOS transistor region P, and an NMOS gate pattern 119P in the NMOS transistor region N, respectively.

Gate spacers 121 may be formed on sidewalls of the cell gate pattern 119C, the PMOS gate pattern 119P, and the NMOS gate pattern 119N.

As mentioned above, NMOS and PMOS gate electrodes may be formed to have a high concentration of impurities, thereby preventing a poly-depletion effect. As a consequence, a dual gate electrode of a CMOS semiconductor device having improved transistor characteristics may be fabricated.

Exemplary embodiments have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a dual gate electrode, comprising:
    forming an initial semiconductor layer doped with impurities of a first conductivity type on a semiconductor substrate having first and second regions;
    partially etching the initial semiconductor layer of the second region to form a recessed semiconductor layer thinner than the initial semiconductor layer;
    implanting impurities of a second conductivity type into the recessed semiconductor layer to define a first semiconductor layer in the first region and a second semiconductor layer in the second region, the second conductivity type being different from the first conductivity type;
    annealing the first and second semiconductor layers; and
    planarizing the annealed first semiconductor layer to remove an upper region of the annealed first semiconductor layer.

2. The method according to claim 1, wherein a majority of impurities in the first semiconductor layer are the first conductivity type, and a majority of impurities in the second semiconductor layer are the second conductivity type.

3. The method according to claim 2, wherein substantially all of the impurities in the first semiconductor layer are the first conductivity type.

4. The method according to claim 1, wherein an impurity concentration of an upper region of the initial semiconductor layer is higher than that of a lower region of the initial semiconductor layer.

5. The method according to claim 1, wherein the initial semiconductor layer is formed of a polysilicon layer.

6. The method according to claim 1, wherein the first and second conductivity types are an n-type and a p-type, respectively.

7. The method according to claim 6, wherein the first and second regions are NMOS and PMOS transistor regions, respectively.

8. The method according to claim 1, wherein the first and second conductivity types are a p-type and an n-type, respectively.

9. The method according to claim 8, wherein the first and second regions are PMOS and NMOS transistor regions, respectively.

10. The method according to claim 1, wherein partially etching the initial semiconductor layer includes etching the initial semiconductor layer by ¼ to ½ of the thickness of the initial semiconductor layer.

11. The method according to claim 1, wherein the impurities in the upper region of the first semiconductor layer are diffused into a lower region of the first semiconductor layer during the annealing process.

12. The method according to claim 1, further comprising:
forming a metal silicide layer on the substrate having the planarized first semiconductor layer; and
patterning the metal silicide layer, the planarized first semiconductor layer and the annealed second semiconductor layer to form first and second gate electrodes in the first and second regions, respectively.

13. A method of fabricating a dual gate electrode, comprising:
preparing a semiconductor substrate having a cell region, an NMOS transistor region and a PMOS transistor region;
etching the semiconductor substrate of the cell region to form a channel trench;
forming an initial semiconductor layer doped with n-type impurities on the substrate to fill the channel trench and cover the semiconductor substrate;
partially etching the initial semiconductor layer of the PMOS transistor region to form a recessed semiconductor layer thinner than the initial semiconductor layer;
implanting p-type impurities into the recessed semiconductor layer to define a first semiconductor layer in the cell region and the NMOS transistor region and a second semiconductor layer in the PMOS transistor region;
annealing the first and second semiconductor layers; and
planarizing the annealed first semiconductor layer to remove an upper region of the annealed first semiconductor layer.

14. The method according to claim 13, wherein the initial semiconductor layer is formed of a polysilicon layer.

15. The method according to claim 13, wherein an impurity concentration of an upper region of the initial semiconductor layer is higher than that of a lower region of the initial semiconductor layer.

16. The method according to claim 13, further comprising:
forming a gate insulating layer on an inner wall of the channel trench and a surface of the semiconductor substrate before forming the initial semiconductor layer.

17. The method according to claim 13, wherein the impurities in the upper region of the first semiconductor layer are diffused into a lower region of the first semiconductor layer during the annealing process.

18. The method according to claim 13, further comprising:
forming a metal silicide layer on the substrate having the planarized first semiconductor layer; and
patterning the metal silicide layer, the planarized first semiconductor layer, and the annealed second semiconductor layer and forming a cell gate electrode, an NMOS gate electrode, and a PMOS gate electrode in the cell region, the NMOS transistor region, and the PMOS transistor region, respectively.

19. A method of fabricating a dual gate electrode, comprising:
preparing a semiconductor substrate having a cell region, a first transistor region and a second transistor region;
etching the semiconductor substrate of the cell region to form a channel trench;
forming an initial semiconductor layer doped with first conductivity type impurities on the substrate to fill the channel trench and cover the semiconductor substrate;
partially etching the initial semiconductor layer of the cell region and the first transistor region to form a recessed semiconductor layer thinner than the initial semiconductor layer;
implanting second conductivity type impurities into the recessed semiconductor layer to define a first semiconductor layer in the cell region and the first transistor region and a second semiconductor layer in the second transistor region;
annealing the first and second semiconductor layers; and
planarizing the annealed second semiconductor layer to remove an upper region of the annealed second semiconductor layer.

20. The method according to claim 19, further comprising masking the second transistor region while implanting the second-type impurities.

21. The method according to claim 19, wherein the first and second transistor regions are NMOS and PMOS transistor regions, respectively.

* * * * *

UNITED STATES PATENT AND TRADEMARK OFFICE
CERTIFICATE OF CORRECTION

PATENT NO. : 7,402,478 B2  Page 1 of 1
APPLICATION NO. : 11/465420
DATED : July 22, 2008
INVENTOR(S) : Tae-Hyun An It is certified that error appears in the above-identified patent and that said Letters Patent is hereby corrected as shown below:

Column 6, line 34, the word "11d" should read --111d --;
Column 6, line 58, the word "nay" should read --may --.

Signed and Sealed this

Sixteenth Day of December, 2008

JON W. DUDAS
*Director of the United States Patent and Trademark Office*